United States Patent
Lee et al.

(10) Patent No.: US 10,666,203 B2
(45) Date of Patent: *May 26, 2020

(54) DEGENERATED TRANSIMPEDANCE AMPLIFIER WITH WIRE-BONDED PHOTODIODE FOR REDUCING GROUP DELAY DISTORTION

(71) Applicant: International Business Machines Corporation, Armonk, NY (US)

(72) Inventors: Wooram Lee, Briarcliff Manor, NY (US); Jonathan E. Proesel, Mount Vernon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/157,772

(22) Filed: Oct. 11, 2018

(65) Prior Publication Data

US 2019/0044482 A1 Feb. 7, 2019

Related U.S. Application Data

(60) Division of application No. 15/706,924, filed on Sep. 18, 2017, now Pat. No. 10,171,042, which is a continuation of application No. 15/278,822, filed on Sep. 28, 2016, now Pat. No. 9,866,184.

(51) Int. Cl.
*H03F 3/08* (2006.01)
*H03F 1/34* (2006.01)
*H03F 3/45* (2006.01)

(52) U.S. Cl.
CPC .......... *H03F 1/34* (2013.01); *H03F 3/45085* (2013.01); *H03F 2203/45034* (2013.01); *H03F 2203/45288* (2013.01)

(58) Field of Classification Search
CPC ......................................................... H03F 3/08
USPC ....................................... 330/308; 250/214 A
See application file for complete search history.

(56) References Cited

U.S. PATENT DOCUMENTS

| 5,105,165 A * | 4/1992 | Bien ....................... H03F 1/302 |
| | | 327/100 |
| 6,504,429 B2 | 1/2003 | Kobayashi |
| 6,781,467 B2 * | 8/2004 | Sun .......................... H03F 1/26 |
| | | 330/149 |
| 6,828,857 B2 | 12/2004 | Paillet et al. |
| 6,864,751 B1 | 3/2005 | Schmidt et al. |
| | (Continued) | |

OTHER PUBLICATIONS

IBM, "Transimpedance Amplifier (TIA) with Coupled Inductor in the Feedback Path for Bandwidth Enhancement," IP.com No. IPCOM000016006D, Aug. 27, 2002, 6 pages.

(Continued)

*Primary Examiner* — Henry Choe
(74) *Attorney, Agent, or Firm* — Daniel P Morris; Ryan, Mason & Lewis, LLP

(57) ABSTRACT

An integrated circuit includes a degeneration network configured to improve group delay across one or more variations, wherein the degeneration network includes a transimpedance amplifier with one or more degeneration inductors. The transimpedance amplifier further includes one or more transistors, and the one or more degeneration inductors are connected after at least one emitter of the one or more transistors.

12 Claims, 9 Drawing Sheets

(56) References Cited

U.S. PATENT DOCUMENTS

| | | | |
|---|---|---|---|
| 7,382,189 B2* | 6/2008 | Chen | H03F 1/56 |
| | | | 330/253 |
| 7,714,663 B2 | 5/2010 | Gong et al. | |
| 7,973,602 B2 | 7/2011 | Shivaram et al. | |
| 8,362,836 B2 | 1/2013 | Gilbert et al. | |
| 8,953,952 B2 | 2/2015 | Poesel et al. | |
| 9,059,665 B2* | 6/2015 | Youssef | H03F 1/223 |
| 9,124,228 B2* | 9/2015 | Xu | H03F 1/342 |
| 9,191,123 B2 | 11/2015 | Kalogerakis et al. | |
| 9,608,568 B2* | 3/2017 | Ro | H03F 1/0205 |
| 2002/0030545 A1 | 3/2002 | Hashemi et al. | |
| 2008/0074187 A1 | 3/2008 | Chen et al. | |
| 2011/0063050 A1* | 3/2011 | Ashida | H03F 3/45179 |
| | | | 333/174 |
| 2012/0291250 A1 | 11/2012 | Escande | |
| 2013/0294784 A1 | 11/2013 | Suzuki | |
| 2013/0328633 A1 | 12/2013 | Zhang et al. | |
| 2014/0159815 A1 | 6/2014 | Cai et al. | |
| 2014/0292413 A1 | 10/2014 | Kim et al. | |
| 2015/0145597 A1 | 5/2015 | Huang et al. | |

OTHER PUBLICATIONS

Z. Lu et al., "Design of a CMOS Broadband Transimpedance Amplifier with Active Feedback," IEEE Transactions on Very Large Scale Integration (VLSI) Systems, Mar. 2010, pp. 461-472, vol. 18, No. 3.

H. Mohammadnezhad et al., "A Low-Power BiCMOS 50 Gbps Gm-Boosted Dual-Feedback Transimpedance Amplifier," IEEE Bipolar/BiCMOS Circuits and Technology Meeting (BCTM), Oct. 26-28, 2015, pp. 161-164.

K.-Y. Park et al., "A 10-Gb/s Trans-Impedance Amplifier with LC-Ladder Input Configuration," IEICE Electronics Express, Aug. 25, 2010, pp. 1201-1206, vol. 7, No. 16.

H.H. Kim et al., "A Si BiCMOS Transimpedance Amplifier for 10-Gb/s SONET Receiver," IEEE Journal of Solid-State Circuits, May 2001, pp. 769-776, vol. 36, No. 5.

List of IBM Patents or Patent Applications Treated as Related.

* cited by examiner

100

200

400

500

600

700

800

900

1000

1100

1200

1300

1310

1400

1500

DEGENERATED TRANSIMPEDANCE AMPLIFIER WITH WIRE-BONDED PHOTODIODE FOR REDUCING GROUP DELAY DISTORTION

BACKGROUND

This disclosure relates generally to a method and/or architecture for implementing amplifiers and, in particular, to methods and/or architectures for implementing transimpedance amplifiers that yield an improved group delay distortion over a range of frequencies.

A transimpedance amplifier (TIA) converts an input current to an output voltage mainly set by a trans-impedance. The TIA may be implemented using an operational amplifier, or op-amp.

A TIA may be implemented to amplify the current output of a photodiode. The TIA presents a low impedance to the photodiode for higher bandwidth and isolates it from the output voltage of the op-amp. The gain of the TIA may be set by a feedback resistor.

Group delay refers to the time delay of amplitude envelopes of the various sinusoidal components of a signal through a device, as a function of frequency for each component. The signal delay can be different for various frequencies, resulting in distortion of signals with multiple frequency components. Such delay variation and resulting distortion can cause problems such as, for example, poor fidelity or intersymbol interference (ISI) in data transmission.

SUMMARY

Illustrative embodiments of the invention provide techniques for implementing transimpedance amplifiers (TIAs) with improved group delay.

For example, in one illustrative embodiment, an integrated circuit includes a degeneration network configured to improve group delay across one or more variations, wherein the degeneration network comprises one or more degeneration inductors.

In another illustrative embodiment, a transimpedance amplifier includes one or more inductors configured to produce a degeneration impedance, wherein an inductance of the one or more inductors is adjusted to improve a group delay in response to one or more variations.

In another illustrative embodiment, a method for improving group delay corresponding to an amplifier includes producing a degeneration impedance, tracking one or more variations, and adjusting one or more components of the amplifier to alter the degeneration impedance in response to the one more variations.

BRIEF DESCRIPTION OF THE DRAWINGS

Exemplary embodiments of the present invention will be described below in more detail, with reference to the accompanying drawings, of which.

DETAILED DESCRIPTION

Figure 1:
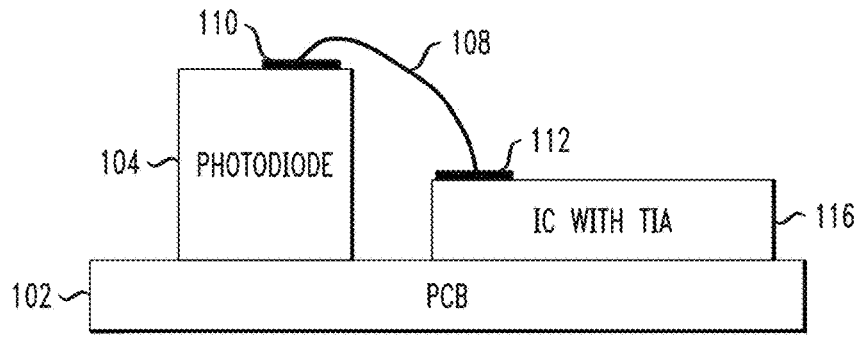
FIG. 1 illustrates a schematic view of a printed circuit board comprising a photodiode wire bonded to an integrated circuit comprising a transimpedance amplifier (TIA), according to an embodiment of the invention.

Exemplary embodiments of the invention will now be discussed in further detail with regard to semiconductor devices and methods of manufacturing same and, in particular, to the implementation of TIAs that yield an improved group delay characteristic so that distortion is reduced over a range of frequencies.

It is to be understood that the various layers and/or regions shown in the accompanying drawings are not drawn to scale, and that one or more layers and/or regions of a type commonly used in, for example, photodiodes, integrated circuits and/or other semiconductor devices may not be explicitly shown in a given drawing or circuit diagram. This does not imply that the layers and/or regions not explicitly shown are omitted from the actual devices. In addition, certain elements may be left out of particular views or circuit diagrams for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

A signal, for instance such as NRZ (non-return-to-zero) signal for data transmission, may be comprised of one or more sinusoidal components. The frequency components of a signal are delayed when passing through a device, such as an amplifier (e.g., TIA). One example of a signal delay is a group delay. Group delay is a time delay of amplitude envelopes of the signal components, and is a function of frequency for each sinusoidal component.

Generally, a delay variation exists, such that signals having multiple frequency components will be distorted. A sufficiently large delay variation may cause problems, including intersymbol interference (ISI), which is a type of signal distortion in which one symbol interferes with subsequent symbols. ISI is not desirable because previous symbols act similarly to noise, thereby making communication unreliable. At a certain threshold, ISI will compromise data integrity. Accordingly, it is advantageous to reduce group delay variation and ISI for greater communication efficiency.

FIG. 1 illustrates an example of a printed circuit board (PCB) assembly 100. PCB assembly 100 includes a PCB 102, a device 104 and an integrated circuit (IC) 116. In one embodiment, and as shown in FIG. 1, device 104 is a photodiode. Photodiode 104 and IC 116 are mounted on a top surface of PCB 102. IC 116 may comprise, for example, analog circuitry including at least one transimpedance amplifier (TIA) whose input is coupled to the output of photodiode 104 via a bond wire 108. The photodiode 104 converts light into current, which is output to the IC 116 via the bond wire 108. The TIA is used to convert the current output from the photodiode to voltage for the next stage of circuit blocks.

Bond wire 108 is attached to photodiode 104 at a contact 110, such as, for example, a bond pad and to IC 116 at another contact 112, such as, for example, a bond pad. The length of bond wire 108 may be a function of the placement of photodiode 104 and IC 116 on PCB 102 and the loop length of the bond wire may be a function of the bonding procedure. In an illustrative example, bond wire 108 may comprise a conductive metal, such as, for example, copper, and may be about 200 µm-about 300 µm in length, but is not necessarily limited thereto. The inductance of bond wire 108 ($L_B$) is a function of its length. Accordingly, the length of bond wire 108 may affect the overall performance of the photodiode and TIA circuit.

Figure 2:
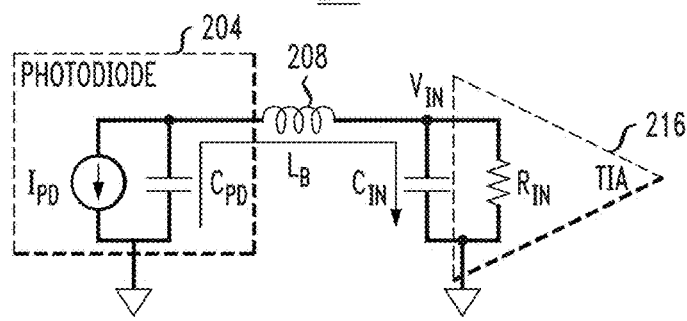
FIG. 2 illustrates a circuit diagram showing the photodiode, bond wire, TIA, and their R/L/C modeling according to an embodiment of the invention.

FIG. 2 illustrates an equivalent circuit 200 depicting photodiode 204, TIA 216, and bond wire 208. As illustrated in FIG. 2, photodiode 204 comprises a current source $I_{PD}$ and a photodiode capacitance $C_{PD}$. The input impedance of TIA 216 comprises an input capacitance $C_{IN}$ and an input resistance $R_{IN}$. Bond wire 208 is shown having a bond wire inductance represented by $L_B$. The bond wire inductance forms a series resonance with photodiode capacitance $C_{PD}$ and the input capacitance $C_{IN}$ of TIA 216. At the resonance frequency, current peaking occurs which distorts the group delay, causing inter-symbol interference (ISI).

In accordance with an embodiment of the present invention, $R_{IN}=R_F/(1+A)$, where $R_{IN}$ is an input resistance of TIA 216, $R_F$ is a feedback resistance of TIA 216, and A is an open loop voltage gain (e.g., $V_{Out}/V_{In}$) of TIA 216.

Figure 3:
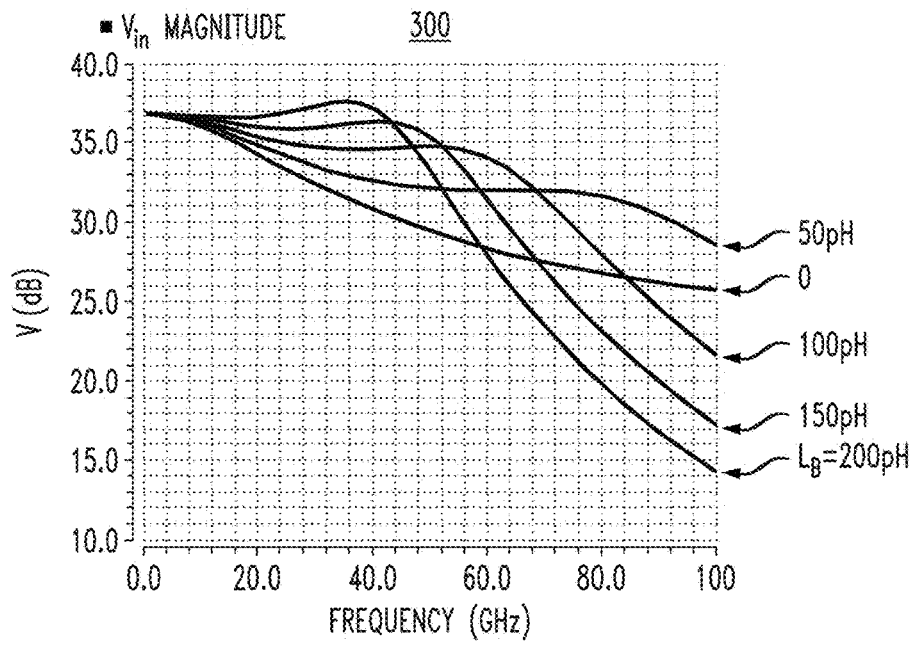
FIG. 3 illustrates a response curve showing the magnitude of an input current from photodiode to a voltage at the TIA input for various values of inductance of the bond wire, according to an embodiment of the invention.
Figure 4:
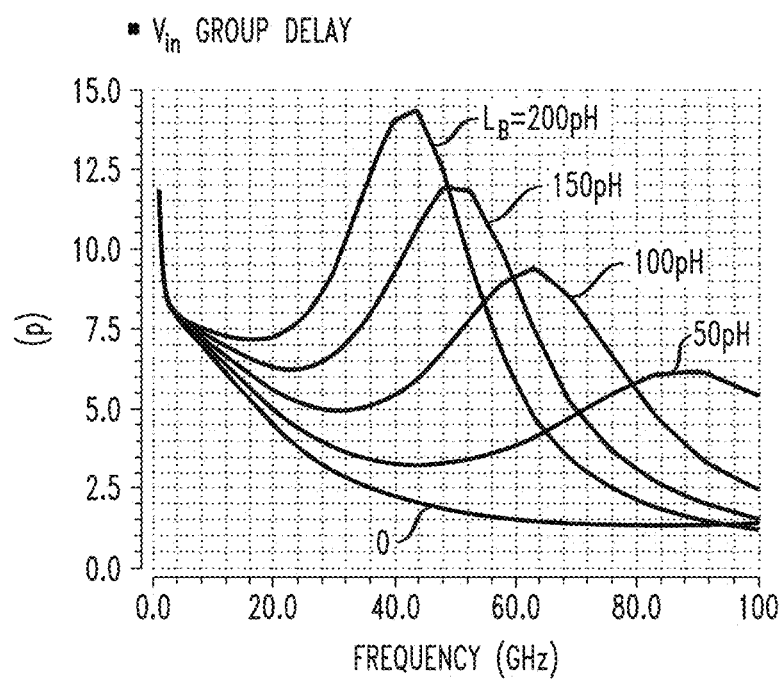
FIG. 4 illustrates a response curve showing the group delay of an input current from photodiode to the TIA input for various values of inductance of the bond wire, according to an embodiment of the invention.

Illustrative graphs depicting magnitude and group delay at the input, $V_{IN}$, of TIA 216 for various values of bond wire inductance $L_B$ are shown in FIGS. 3 and 4, respectively. For purposes of explanation, the following values of capacitance and resistance were assumed, but the embodiments of the invention are not limited thereto: $C_{PD}$=110 fF, $C_{IN}$=70 fF, $R_{IN}=R_F/(1+A)$=35 ohms, wherein $R_F$=260 ohms and A≈6.4. For purposes of explanation, the inductance of bond wire 208 varies from about 0 picohenries (pH) to about 200 pH, but the embodiments of the invention are not limited thereto. As can be understood from graph 300 in FIG. 3, the inductance of the bond wire tunes the bandwidth of $V_{IN}$. However, as shown in graph 400 in FIG. 4, an increase in bond wire inductance results in a distortion of the group delay, illustrated by the varying (e.g., non-flat) curvature of the plots with increasing inductance.

Figure 5:
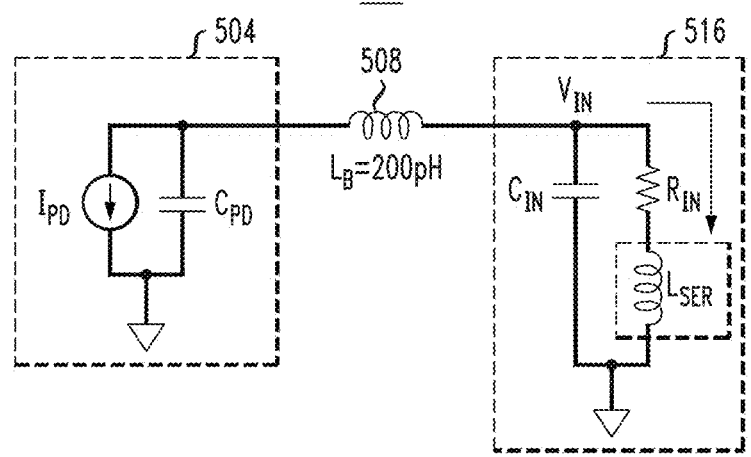
FIG. 5 illustrates a circuit diagram showing a configuration for improving group delay by addition of an inductance in series with the input resistance of a TIA, according to an embodiment of the invention.

In accordance with an embodiment of the present invention, the current peaking into a TIA 516 at resonance may be reduced by placing an inductor $L_{SER}$ in series with $R_{IN}$, thereby increasing the input impedance. FIG. 5 illustrates an example of such a configuration, where $L_{SER}$ is placed in series with $R_{IN}$ in TIA 516. FIG. 5 includes photodiode 504 and bond wire 508.

Figure 6:
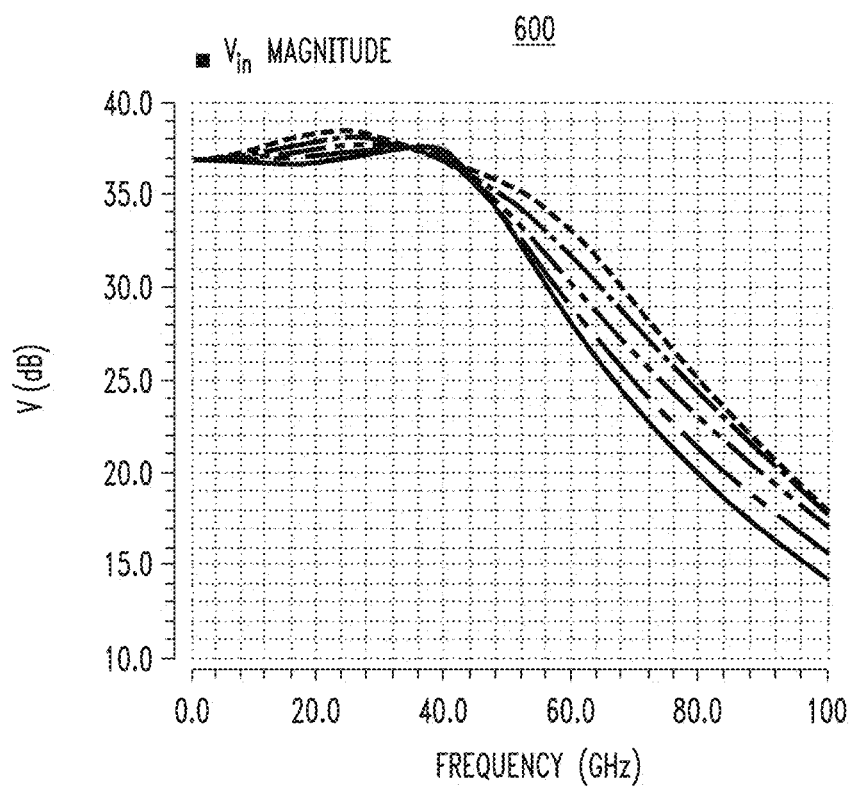
FIG. 6 illustrates a response curve showing the magnitude of an input current from photodiode to a voltage at the TIA input for various values of inductance in series with the TIA input resistance, according to an embodiment of the invention.
Figure 7:
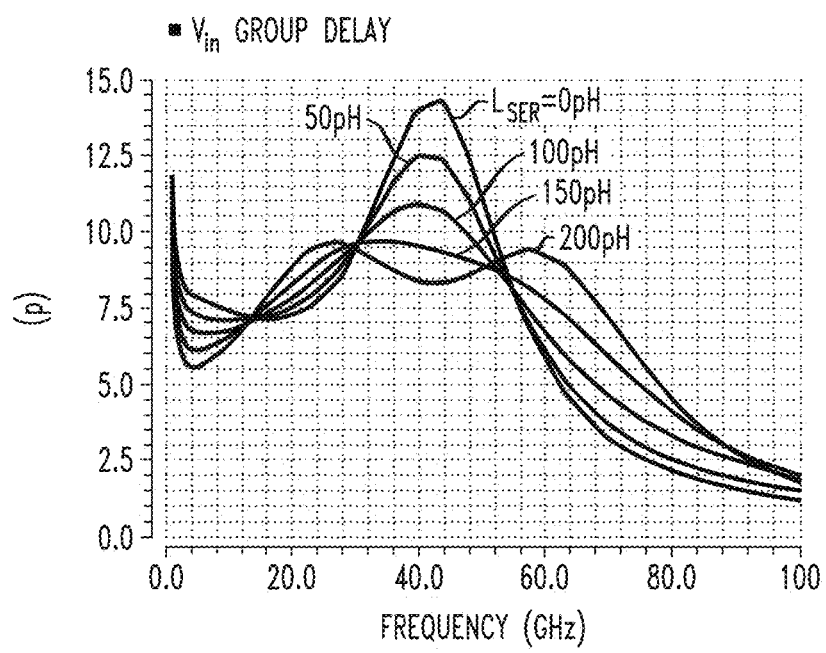
FIG. 7 illustrates a response curve showing group delay of an input current from photodiode to the TIA input for various values of an inductance in series with an input resistance of the TIA, according to an embodiment of the invention.

Illustrative graphs depicting magnitude and group delay at the input, $V_{IN}$, of TIA 516 for a bond wire inductance $L_B$ of 200 pH and various values of inductance $L_{SER}$ are shown in FIGS. 6 and 7, respectively. For purposes of explanation, the following values of capacitance and resistance were assumed, but the embodiments of the invention are not limited thereto: $C_{PD}$=110 fF, $C_{IN}$=70 fF, $R_{IN}=R_F/(1+A)$=35 ohms, wherein $R_F$=260 ohms and A≈6.4. For purposes of explanation, the inductance of inductor $L_{SER}$ in series with $R_{IN}$ varies from about 0 picohenries (pH) to about 200 pH, but the embodiments of the invention are not limited thereto. As can be understood from graph 600 in FIG. 6, current peaking is reduced as a result of placing $L_{SER}$ in series with $R_{IN}$. The graph 700 in FIG. 7 illustrates the flattening of the group delay as $L_{SER}$ is increased from about 0 pH to about 200 pH.

Figure 8:
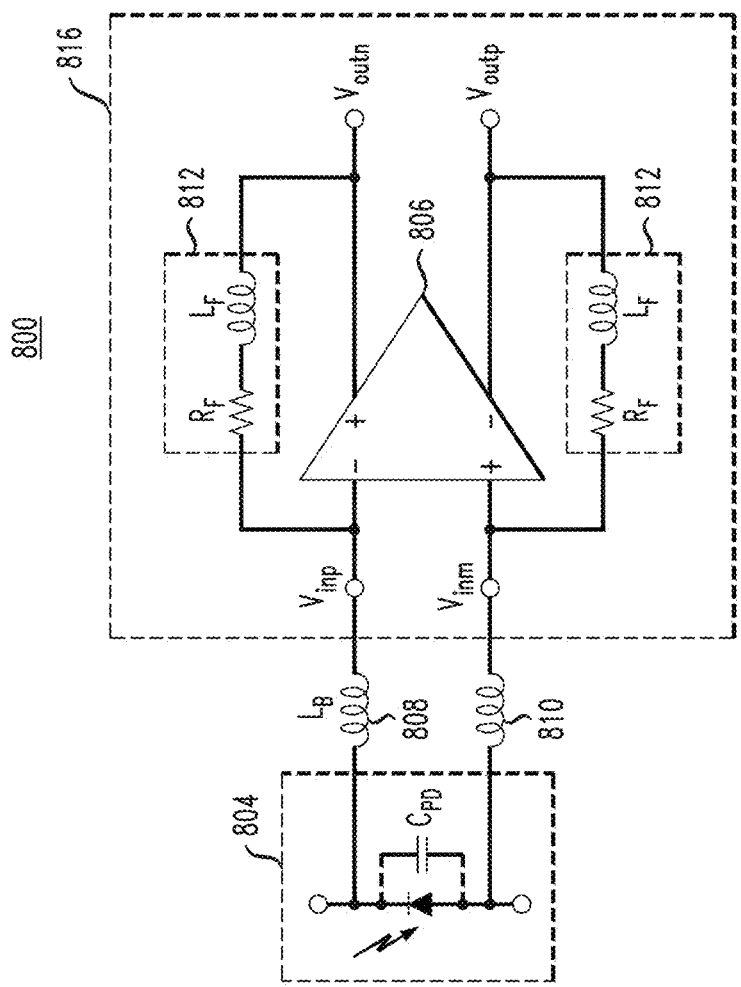
FIG. 8 illustrates a circuit diagram showing inductors placed in series with feedback resistors of the TIA, according to an embodiment of the invention.

FIG. 8 illustrates an equivalent circuit 800 illustrating one implementation of $L_{SER}$ into a TIA 816. The circuit 800 illustrates a differential amplifier circuit including photodiode 804 having an output capacitance $C_{PD}$, bond wire 808 having an inductance $L_B$, interconnect wire 810, and TIA 816. The TIA 816 includes feedback network 812 and inverting amplifier 806. In one embodiment, and as shown in FIG. 8, $L_{SER}$ is implemented in TIA 816 by adding inductors LE in series with feedback resistors $R_F$.

In the circuit of FIG. 8, $Z_{IN}=(R_F+j\omega L_F)/(1+A)$ and $L_{SER}=L_F/(1+A)$, where $Z_{IN}$ is an input impedance of TIA 816, $R_F$ is a feedback resistance of TIA 816, $L_F$ is an inductance of inductors in series with feedback resistors RE, and A denotes the open-loop gain of the amplifier 806. In order to implement an $L_{SER}$ of about 100 pH, $L_F$ would have to be about 740 pH for an open loop gain A of about 6.4. Such a large inductance would significantly distort the trans-impedance gain of the amplifier 806.

Figure 9:
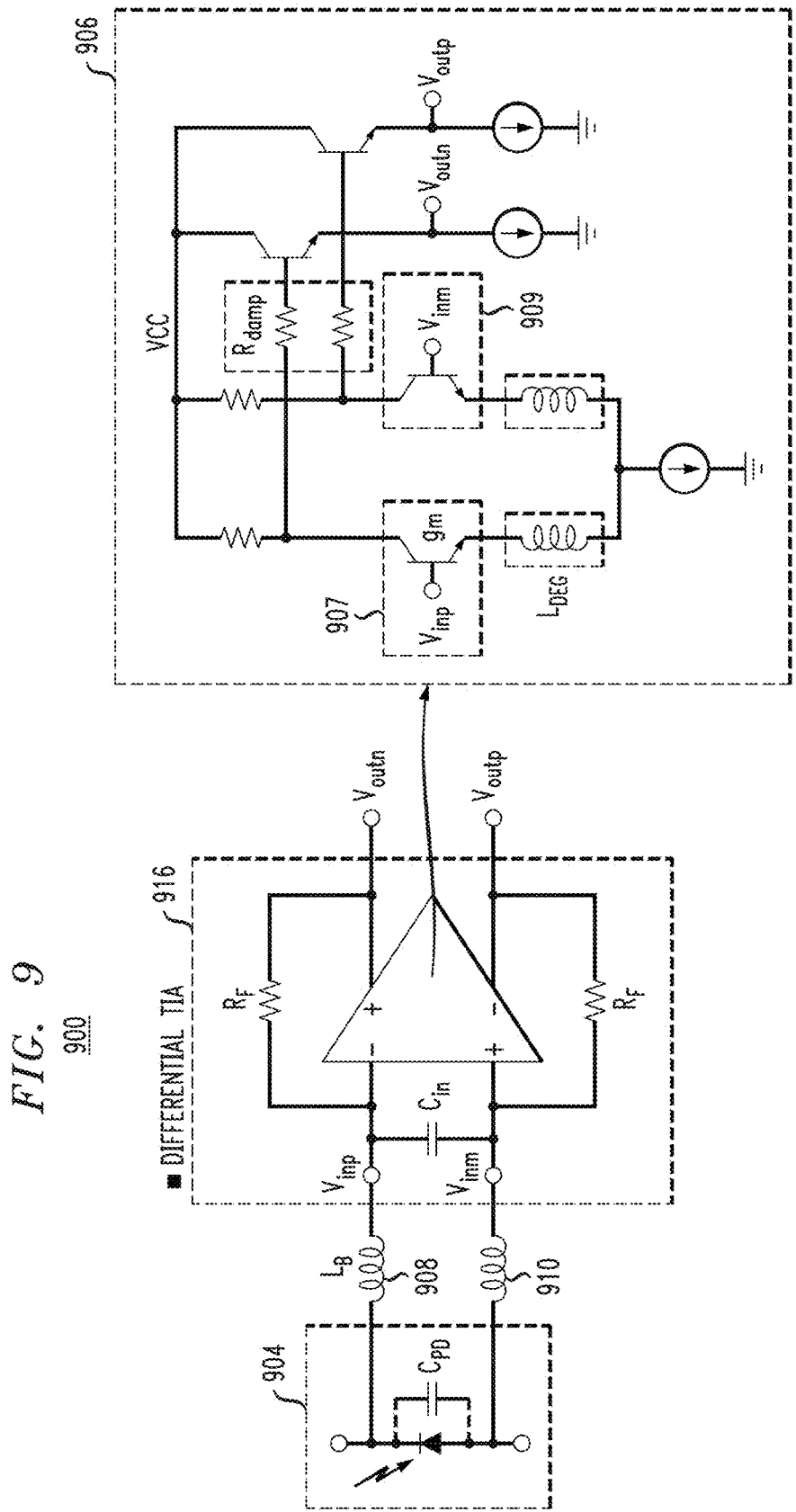
FIG. 9 illustrates a circuit diagram showing an inductor-degenerated TIA, according to an embodiment of the invention.

FIG. 9 illustrates an equivalent circuit diagram 900 showing an inductor-degenerated TIA, according to an embodiment of the invention. More specifically, FIG. 9 illustrates TIA 916 comprising a differential inverting amplifier 906 and feedback resistors $R_F$. The TIA 916 is connected to photodiode 904 having an output capacitance $C_{PD}$, bond wire 908 having an inductance $L_B$, and interconnect wire 910. The differential inverting amplifier 906 shown in FIG. 9 illustrates a simplified detail of the internal structure of the inverting amplifier 906 within the TIA 916. Inverting amplifier 906 includes degeneration inductors $L_{DEG}$ placed in the emitter circuits in series with and after the emitter for a bipolar junction transistor (BJT) (or source for a field-effect transistor (FET), such as a metal oxide semiconductor FET (MOSFET)) of both plus and minus input transistor devices 907, 909 of a differential input stage.

Plus input transistor 907 receives a voltage input ($V_{imp}$) at a base (or gate) thereof functioning as a positive terminal, and minus input transistor 909 receives a voltage input ($V_{inm}$) at a base (or gate) thereof functioning as a negative terminal. For the circuit shown in FIG. 9, $Z_{IN}$ may be expressed by the following equation:

$$Z_{IN}=R_F/(1+A)+g_mR_F/(1+A)*j\omega L_{DEG},$$

where $Z_{IN}$ is an input impedance of TIA 916, $R_F$ is a feedback resistance of TIA 916, $g_m$ is transconductance of a transistor, $L_{DEG}$ is an inductance of degeneration inductors, and A denotes the gain of the amplifier 906.

The equivalent input inductance $L_{SER}$, as illustrated in FIG. 5, is determined by the following equation:

$$L_{SER}=g_mR_FL_{DEG}/(1+A)$$

In a non-limiting illustrative example, for $g_m=0.2$ A/V, $R_F=260$ ohms, and A=6.4, an $L_{DEG}$ of 20 pH results in an $L_{SER}$ of 140 pH. The relatively small inductance of a degeneration inductor $L_{DEG}$ is boosted by $g_mR_F$ at the input impedance resulting in a larger series inductance $L_{SER}$ of input impedance. In the equivalent circuit in FIG. 9, the relatively small $L_{DEG}$ does not directly affect the transimpedance gain of the TIA 916. In accordance with an embodiment of the present invention, the series resonant effect of inductance $L_B$ on group delay may be significantly reduced by the degeneration inductors, $L_{DEG}$, in the TIA 916

In accordance with an embodiment of the present invention, the TIA 916 further includes damping resistors $R_{damp}$, which have a damping effect on the circuit and reduce oscillation. Alternatively, the damping resistors $R_{damp}$ can be omitted. The TIA further includes designations for collector supply voltage ($V_{cc}$), positive voltage output ($V_{outp}$), and negative voltage output ($V_{outm}$).

Figure 10:
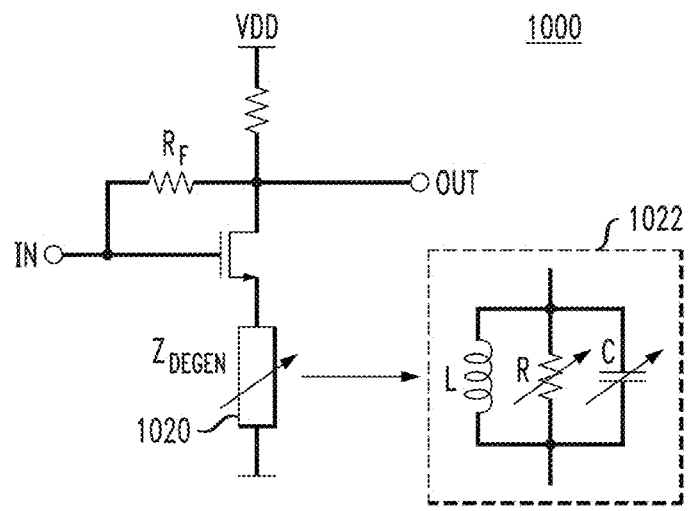
FIG. 10 illustrates a circuit diagram showing a tunable degeneration network, according to an embodiment of the invention.

In accordance with an embodiment of the present invention, FIG. 10 illustrates an equivalent circuit diagram 1000 having a tunable degeneration network ($Z_{DEGEN}$) 1020 including, for example, a single-ended TIA. Tunable degeneration network 1020 may be used to improve the group delay by flattening the group delay (see, e.g., FIG. 7) across variations that include, but are not necessarily limited to, bond wire length, process, voltage, temperature, and photodiode parasitic capacitance. The tunable degeneration network of FIG. 10 illustrates $Z_{DEGEN}$ realized as an RLC circuit 1022 with a fixed inductance L, and tunable resistance R and capacitance C connected in parallel. However, the embodiments of the present invention are not limited thereto. For example, one or more of each of R, L and C can be fixed or varied. $Z_{DEGEN}$ could be any network, passive or active, such as, for example, a network including TIAs like those described in connection with FIGS. 9 and 14 herein, that achieves the desired effect of improving group delay. In one embodiment, at least one of the R and C values are based on the bond wire length and the photodiode parasitic capacitance.

Figure 11:
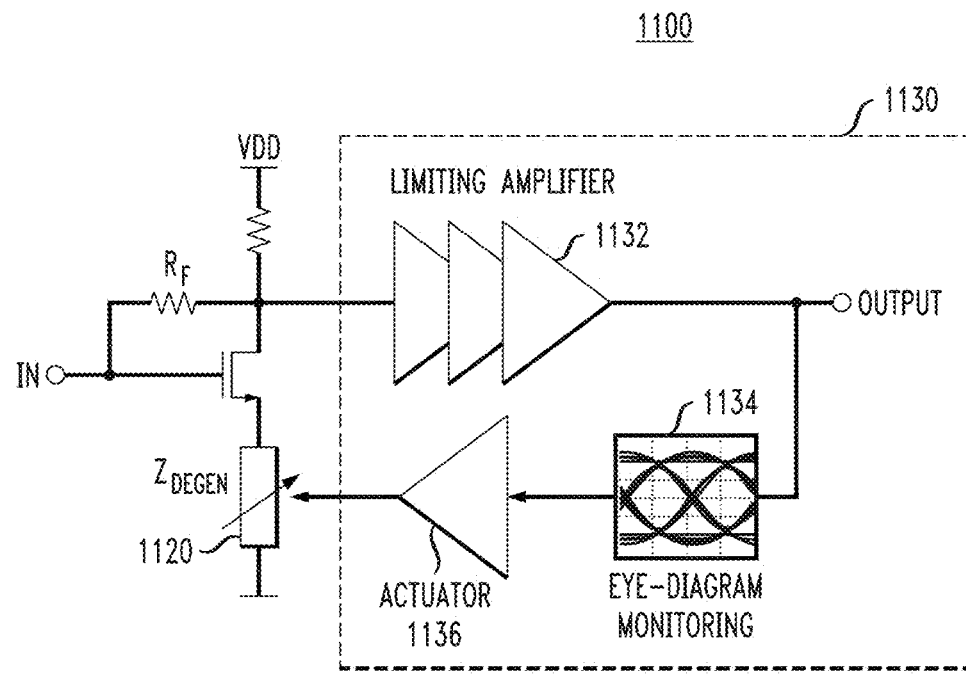
FIG. 11 illustrates a schematic view showing a configuration for tuning a degeneration network to track changes in TIA input impedance and wire-bond length, according to an embodiment of the invention.

FIG. 11 illustrates a schematic 1100 depicting an exemplary process, voltage, temperature (PVT) and bond wire length tracking feedback loop 1130. The input impedance of the TIA is sensitive to process, voltage, and temperature variation effects. In addition, the length of the bond wire may not be well controlled during fabrication, and may vary by as much as, for example, +/−20%. These variations in process, voltage, temperature and bond wire length can lead to, for example, channel noise and intersymbol interference (ISI), which affect the performance of data transmission. Tracking feedback loop 1130 is operative to monitor the output of the TIA and to adjust $Z_{DEGEN}$ 1120 in order to compensate for these variations in process, voltage, temperature and bond wire length, resulting in flattening the group delay. Tracking feedback loop 1130 comprises limiting amplifier 1132, eye diagram monitor 1134, and actuator 1136. Eye diagram monitor 1134 is configured to display and/or output an eye diagram and/or analyze the eye diagram to determine the effects of the variations in process, voltage, temperature and bond wire length, and to determine how $Z_{DEGEN}$ 1120 can be tuned in order to compensate for these variations and achieve an optimum eye diagram.

As used herein, an "eye diagram" can refer to an oscilloscope display in which a digital signal from a receiver is repetitively sampled and applied to a vertical input, while a data rate is used to trigger a horizontal sweep. A user and/or an automated tuning system may use the eye diagram as a tool to evaluate the effects of the variations in process, voltage, temperature and bond wire length. In one embodiment, the eye diagram displayed by eye diagram monitor 1134 is a function of $Z_{DEGEN}$ 1120, and, consequently, of the degeneration impedance. The actuator 1136 is operative to tune or adjust components within $Z_{DEGEN}$ 1120 in order to adjust a degeneration impedance, and achieve a desired eye diagram (e.g., an optimum eye diagram). The addition of damping resistors, as noted herein in connection with FIGS. 9 and 14, can also be used to help optimize an eye diagram.

In accordance with an embodiment of the present invention, $Z_{IN}=R_F/(1+A)+g_mR_F/(1+A)*Z_{DEGEN}$.

Figure 12:
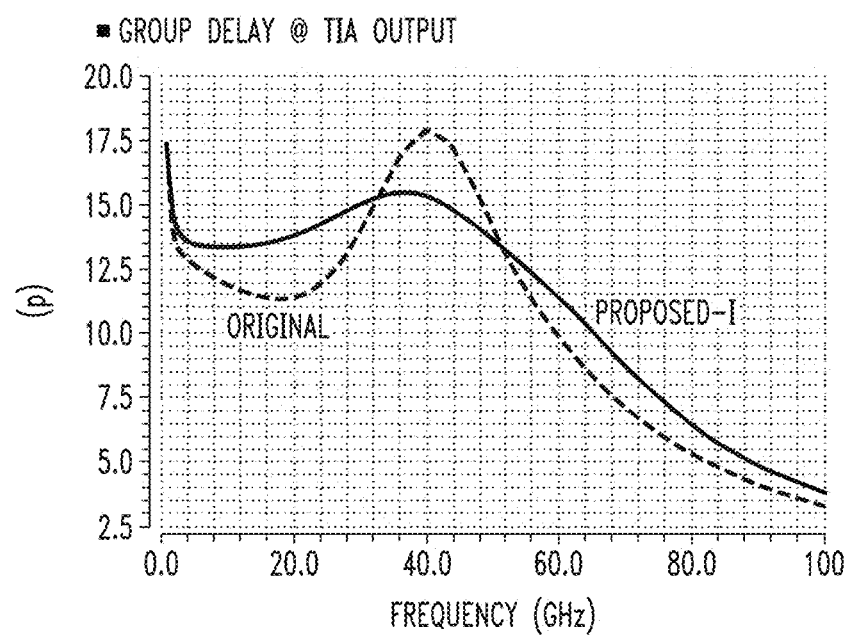
FIG. 12 illustrates a response curve illustrating group delay at the output of a TIA, according to an embodiment of the invention.

FIG. 12 illustrates a graph 1200 showing the flattening of the group delay by providing a degeneration inductor $L_{DEG}$ into a TIA, in accordance with the embodiment described in connection with FIG. 9. Graph 1200 compares the group delay resulting from a configuration including TIA 916 illustrated in FIG. 9, and having an $L_{DEG}$=20 pH (plot marked as proposed-I), with a TIA without the degeneration inductor $L_{DEG}$ (plot marked as original). In this illustrative example, the group delay variation associated with the TIA without the degeneration inductor $L_{DEG}$ was approximately 6.5 ps over a given frequency range, while the group delay variation associated with the TIA having the degeneration inductor $L_{DEG}$ was approximately 2 ps over a given frequency range, representing a significant improvement (e.g., flattening).

Figure 13A:
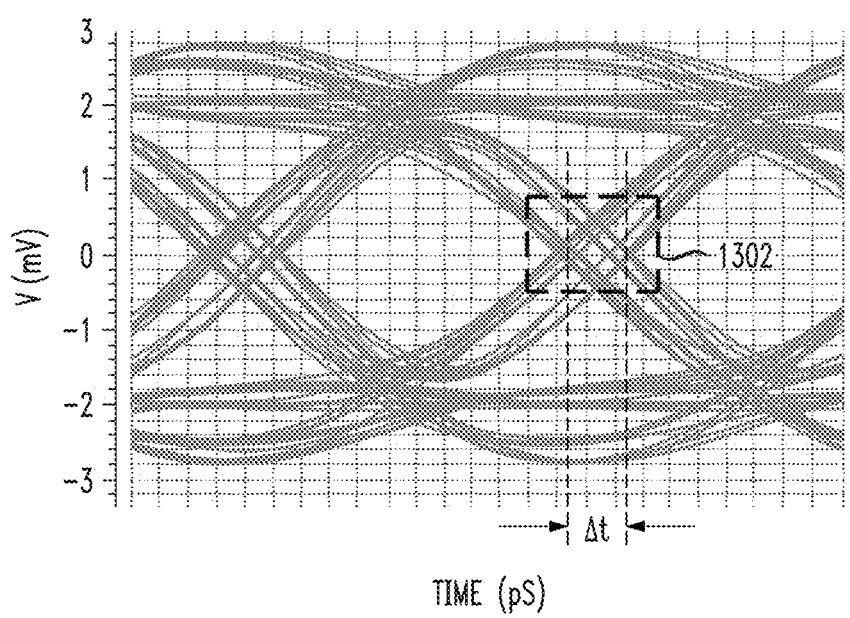
FIG. 13A illustrates an eye-diagram at the output of a TIA without degeneration.
Figure 13B:
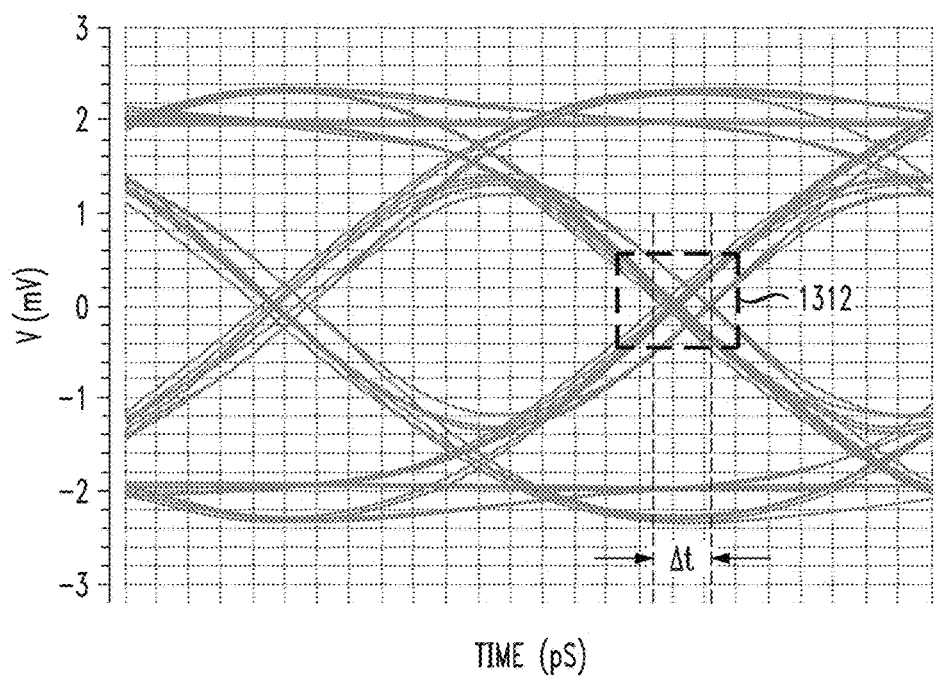
FIG. 13B illustrates an eye-diagram at the output of a TIA with degeneration, according to an embodiment of the invention.

With reference to FIGS. 13A and 13B, eye diagrams 1300 and 1310 illustrate a measurement of jitter resulting from the effects of ISI, including group delay distortion, in connection with TIAs without a degeneration inductor and with a degeneration inductor, respectively. In one embodiment, the jitter is measured as the difference in time, Δt, between the left most portion of the repetitive waveform and the right most portion of the repetitive waveform in the region of the waveform indicated as 1302 and 1312. As can be seen from a comparison of the waveforms in FIGS. 13A and 13B, the eye diagram 1310 in FIG. 13B corresponding to the TIA with degeneration exhibits improved jitter over the eye diagram 1300 in FIG. 13A corresponding to the TIA without degeneration.

Figure 14:
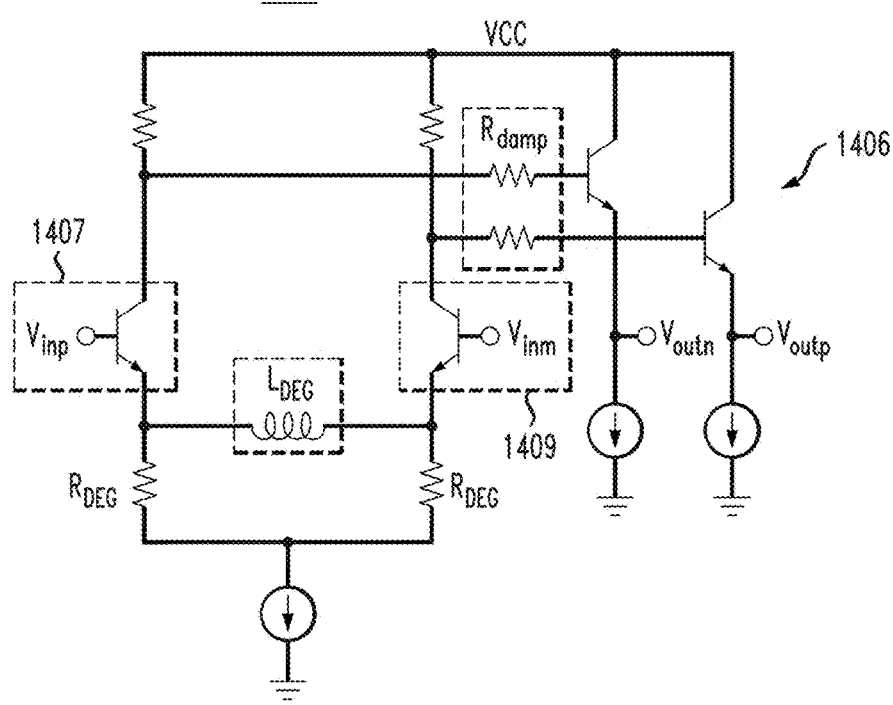
FIG. 14 illustrates another example of implementation of an inductor-degenerated TIA, according to an embodiment of the invention.

FIG. 14 is an equivalent circuit diagram 1400 showing inverting amplifier 1406 of a TIA similar to the configuration of inverting amplifier 906 of TIA 916 shown in FIG. 9. Specifically, FIG. 14 illustrates an alternative placement of the degeneration inductor, $L_{DEG}$, in the inverting amplifier 1406. In the FIG. 14 arrangement, $L_{DEG}$ is connected between the emitters of the input transistors 1407 and 1409, which are coupled to the differential inputs $V_{INP}$ and $V_{INM}$. In addition, the FIG. 14 arrangement includes degeneration resistors, $R_{DEG}$, connected as shown. Each $R_{DEG}$ is coupled to the junction of one of the emitters and ends of $L_{DEG}$. When the frequency is low, $L_{DEG}$ is dominant, but as the frequency increases, $R_{DEG}$ limits the impedance of $L_{DEG}$. In one embodiment, $R_{DEG}$ has a value equal to 15 ohms, and the $L_{DEG}$ of FIG. 14 has a value equivalent to about twice that of the $L_{DEG}$ of FIG. 9 ($2L_{DEG}$).

Similar to the embodiment in FIG. 9, the inverting amplifier 1406 further includes damping resistors $R_{damp}$, which have a damping effect on the circuit and reduce oscillation to optimize the eye diagram. Alternatively, the damping resistors $R_{damp}$ can be omitted from the configuration in FIG. 14.

Figure 15:
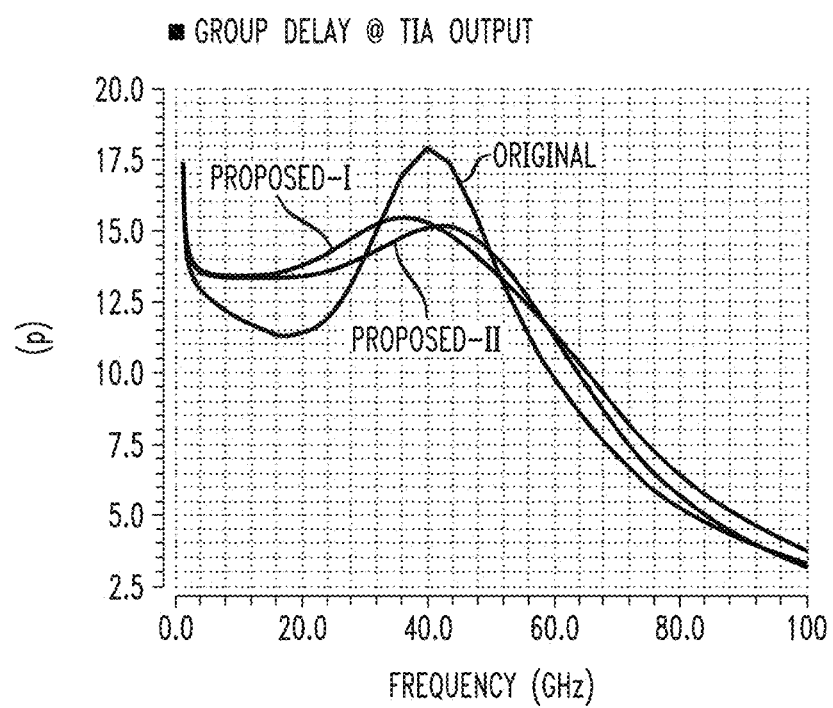
FIG. 15 illustrates a response curve illustrating group delays at the output of a TIA for a conventional implementation and various degeneration implementations, according to embodiments of the invention.

FIG. 15 illustrates a graph 1500 showing a comparison of group delay responses for TIA configuration illustrated in FIG. 9 (Proposed-I), TIA configuration illustrated in FIG. 14 (Proposed-II), and a TIA configuration without the degeneration inductors $L_{DEG}$ of the FIGS. 9 and 14 configurations (Original). As shown, the plots illustrate that both proposed-I and proposed-II TIA configurations result in significantly improved (flattened) group delay over the original TIA configuration. Referring to FIG. 15, the proposed-II configuration provides a flatter group delay response and wider bandwidth when compared with the proposed-I configuration. Accordingly, incorporating degeneration impedance within a TIA configuration advantageously improves group delay as compared to a TIA configuration without the degeneration inductors $L_{DEG}$.

Exemplary embodiments of the present invention relate to a feedback TIA producing a degeneration impedance for flattening a group delay and reducing an ISI. The TIA can be a shunt feedback TIA formed with an inductor, capacitor and a resistor, where the value of each component is optimized for a given wire bond inductor and/or photodiode/parasitic capacitance. The degeneration impedance may be programmable in response to tracking variations, such as, but not necessarily limited to, process, voltage, temperature and bond wire length.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for improving group delay across one or more variations corresponding to a transimpedance amplifier, the method comprising:
   producing a degeneration impedance by a degeneration inductor;
   wherein the transimpendance amplifier comprises an inverting amplifier including the degeneration inductor;
   monitoring the degeneration impedance through a tracking feedback loop; and
   adjusting an inductance of the degeneration inductor to alter the degeneration impedance in response to the one more variations;
   wherein the inverting amplifier comprises:
      a first transistor coupled to a positive voltage input; and
      a second transistor coupled to a negative voltage input;
   wherein the degeneration inductor is connected between emitters of the first and second transistors.

2. The method according to claim 1, wherein the one or more variations comprise at least one of bond wire length, process, voltage and temperature.

3. The method according to claim 1, further comprising flattening a group delay profile over a frequency range, wherein the group delay profile corresponds to the inductance of the degeneration inductor.

4. The method according to claim 1, wherein:
   the transimpedance amplifier is electrically connected to a device via a bond wire; and
   the degeneration impedance flattens the group delay associated with an inductance of the bond wire.

5. The method according to claim 4, wherein the device is a photodiode.

6. A method for improving group delay across one or more variations corresponding to a transimpedance amplifier, the method comprising:
   producing, by one or more inductors, a degeneration impedance;
   wherein the transimpendance amplifier comprises an inverting amplifier including the one or more inductors;
   monitoring the degeneration impedance; and
   adjusting an inductance of the one or more inductors to alter the degeneration impedance in response to the one more variations;
   wherein the inverting amplifier comprises:
      a first transistor coupled to a positive voltage input; and
      a second transistor coupled to a negative voltage input;
   wherein the one or more inductors are connected between emitters of the first and second transistors.

7. The method according to claim 6, wherein the one or more variations comprise at least one of bond wire length, process, voltage and temperature.

8. The method according to claim 6, further comprising flattening a group delay profile over a frequency range, wherein the group delay profile corresponds to the inductance of the one or more inductors.

9. The method according to claim 6, wherein:
the transimpedance amplifier is electrically connected to a device via a bond wire; and
the degeneration impedance flattens the group delay associated with an inductance of the bond wire.

10. The method according to claim 9, wherein the device is a photodiode.

11. The method according to claim 1, wherein:
a first resistor is coupled to a junction of a first one of the emitters and a first end of the degeneration inductor; and
a second resistor is coupled to a junction of a second one of the emitters and a second end of the degeneration inductor.

12. The method according to claim 6, wherein:
a first resistor is coupled to a junction of a first one of the emitters and a first end of an inductor of the one or more inductors; and
a second resistor is coupled to a junction of a second one of the emitters and a second end of the inductor of the one or more inductors.

\* \* \* \* \*